United States Patent [19]

Velsher

[11] Patent Number: 4,491,797
[45] Date of Patent: Jan. 1, 1985

[54] TEST CONTACT RESISTANCE OF DRY CIRCUIT CONTACTS

[75] Inventor: Benne Velsher, Nepean, Canada

[73] Assignee: Northern Telecom Limited, Montreal, Canada

[21] Appl. No.: 383,598

[22] Filed: Jun. 1, 1982

[51] Int. Cl.³ ............................................. G01R 31/02
[52] U.S. Cl. .................................... 324/421; 324/64; 324/415
[58] Field of Search ............... 324/62, 64, 158 F, 415, 324/421, 424, 418

[56] References Cited

U.S. PATENT DOCUMENTS

| | | | |
|---|---|---|---|
| 2,810,109 | 10/1957 | Breggin | 324/415 |
| 3,217,243 | 11/1965 | Franklin | 324/421 |
| 3,510,760 | 5/1970 | Hellstrom et al. | 324/64 |
| 3,515,982 | 6/1970 | Longworth et al. | 324/424 |
| 3,928,795 | 12/1975 | Lechner | 324/421 |
| 4,232,262 | 11/1980 | Emo et al. | 324/64 |

FOREIGN PATENT DOCUMENTS 55-72218  5/1980  Japan ................................... 324/415

OTHER PUBLICATIONS

Relay Testing Procedures, Tech. Committee II Progress Report, NARM, 4/59, p. 11.
Relays, Radio Electronics, 1/62, pp. 46–48.
Relay Testing, Electrical Review, 2/46 pp. 293-295.

Primary Examiner—Michael J. Tokar
Attorney, Agent, or Firm—Sidney T. Jelly

[57] ABSTRACT

In the testing of dry circuit contacts, a constant current source is applied to the contacts. The open circuit voltage of the source is set to a predetermined maximum value and then the short circuit current at the contacts measured. If the current value is below a predetermined maximum value, the voltage of the source is increased to bring the short-circuit current to the predetermined value. The voltage drop across the contacts is then measured and the contact resistance calculated. This arrangement makes adjustments to take into account variations in the test circuit, such as different lead lengths and other variables, without subjecting the contacts at any time to an open circuit voltage or short circuit current above maximum values.

13 Claims, 2 Drawing Figures

TEST CONTACT RESISTANCE OF DRY CIRCUIT CONTACTS

This invention is concerned with the testing of the contact resistance of dry circuit contacts, and is particularly concerned with low power contacts, that is low voltage, low current contacts. Such contacts are used in large numbers, particularly in telecommunications and other systems using solid state, semiconductor devices and components.

The primary requirement for dry circuit testing of contacts is that the voltage and current applied to the test contacts must never be allowed to exceed certain maximum limits. Standards are laid down for testing, of contacts, by the ASTM, and for dry circuit contacts, a maximum of 20 mV open circuit voltage and 100 mA short-circuit current are stipulated. This sets a maximum value of 0.2Ω resistance for the circuit.

In testing, long leads, use of relays to close switches to bring test contacts into the circuit, and number of contacts being tested and other features, result in a high circuit resistance over 0.2Ω. To maintain 100 mA, it is necessary to have a higher than 20 mV open circuit voltage, which is against the test specification. Alternatively, if a 20 mV limit is maintained, the short-circuit current drops, resulting in poor reading resolution.

The present invention provides for testing contacts by applying a 20 mV open circuit voltage, and 100 mA short-circuit current to the contacts, thus comforming to the test specification, then after closing the test contacts, if normally open, measuring the current in the circuit. If this is over a preset low value, for example 0.5 mA, which shows that the contacts are "good", then the test proceeds. If the current is below 100 mA, the voltage of the constant current source is increased until the current in the circuit is 100 mA. The voltage drop across the test contacts is then measured and the contact resistance calculated.

The invention will be readily understood by the following description in conjunction with the accompanying drawings in which.

Figure 1:
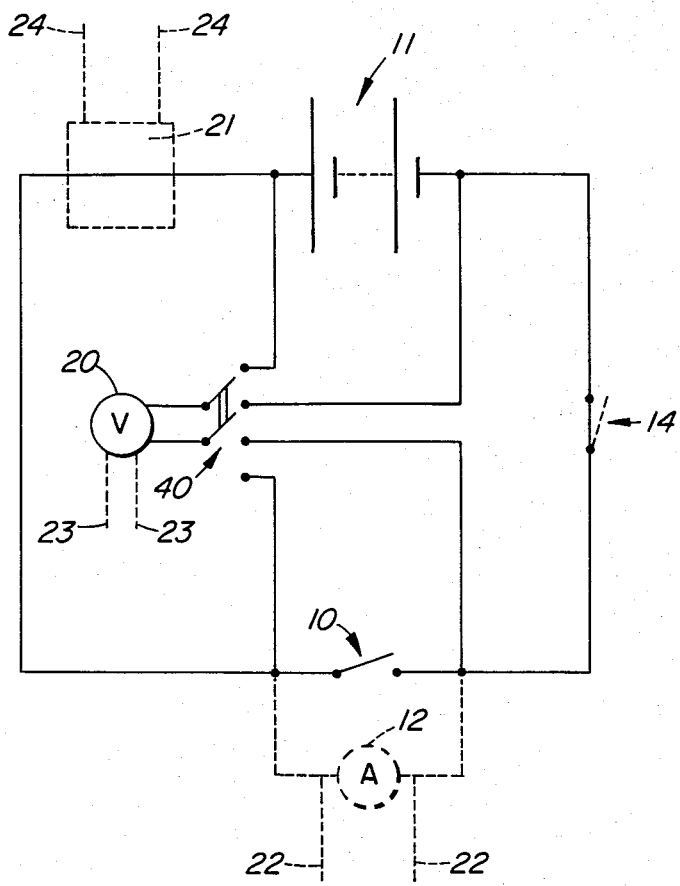
FIG. 1 is a diagramatic representation of the basic test circuit.

As illustrated in FIG. 1, the contacts to be tested, indicated generally at 10, are connected into a circuit having a constant current source, indicated at 11. For the purpose of the test, the constant current source 11 should supply electrical energy at a predetermined voltage. The current flowing in the circuit, when the contacts 10 are closed, is measured by a meter 12 across the contacts 10.

The contacts 10 may comprise a normal switch, having contacts moved together to make, or a switch in which the contacts are normally made, being moved to break contact. A further alternative is one in which a terminal pin, or similar member, is inserted into a female contact member, electrical contact occuring between pin and contact member on one or more surfaces. It may be desirable to maintain the circuit open until the contacts are in the circuit, particularly in the case of male and female contact members. To this extent, a further switch 14 can be provided. The contact to be tested can then be inserted into the test circuit and then by closing switch 14, the test carried out.

The test conditions, as set by the test standards, are that the contacts are subject to a maximum voltage of 20 mV open circuit voltage and maximum current of 100 mA, short-circuit. Such perameters give a maximum resistance to the circuit of 0.2Ω, as stated above.

Figure 2:
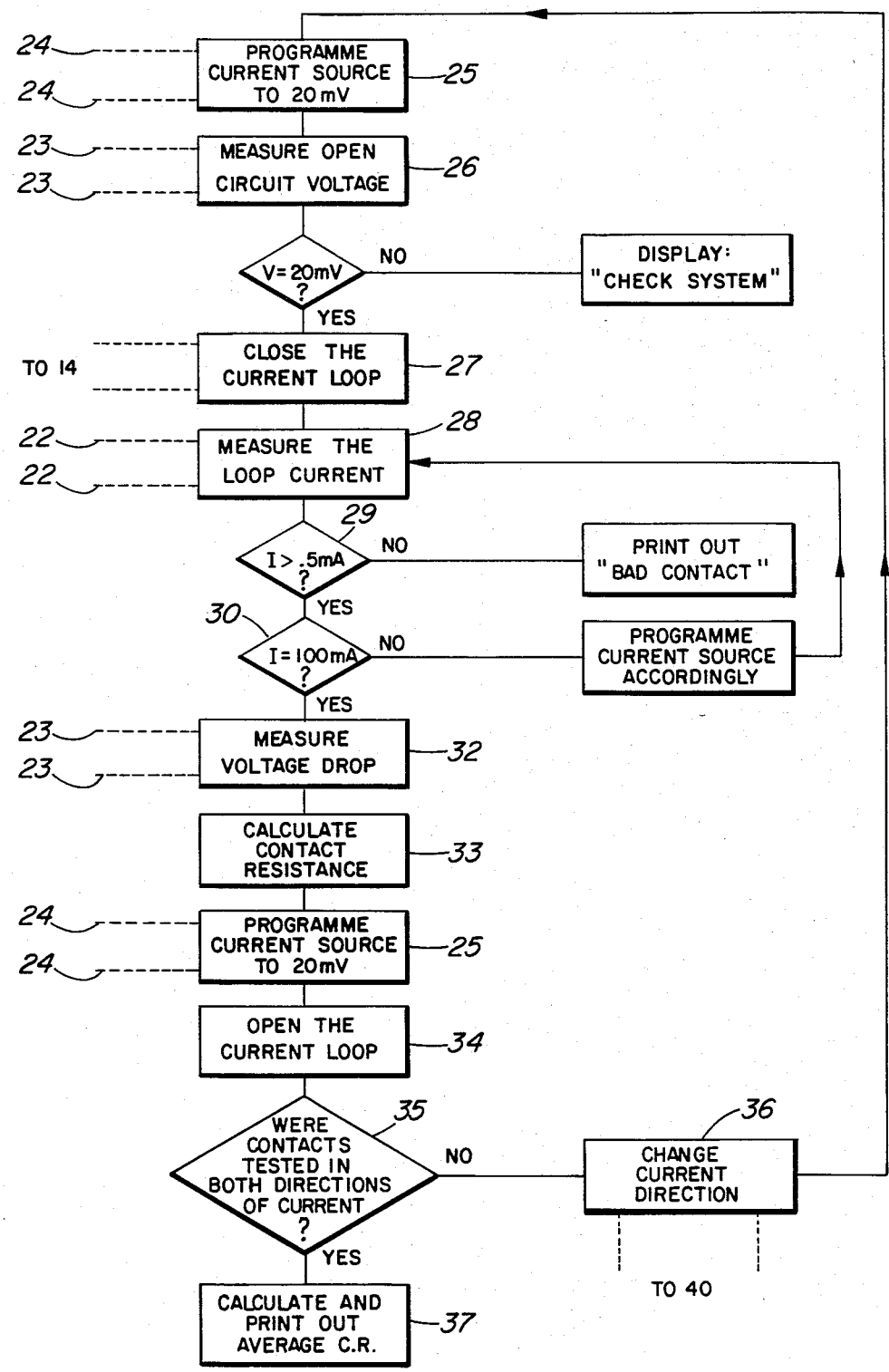
FIG. 2 is a diagramatic representation of a test system in accordance with the invention.

FIG. 2 is a diagramatic representation of a system for testing dry contacts. For the system as in FIG. 2, a voltage measuring device is required in the circuit of FIG. 1, for example at 20. Also a control device for controlling the current source, or power source 11, is required, as indicated at 21.

The system of FIG. 2 can be automated to test a plurality of contact sets or pairs by a system of stepping, but for the description of the invention, it will be described as for one set or pair. With a circuit as in FIG. 1, connections extend from the various items, current measuring device 12, voltage measuring device 20 and control device 21 to appropriate members of the system. Thus the current, voltage and control connections are indicated at 22, 23 and 24 respectively.

The operation of the system can be understood quite readily from FIG. 2. Assuming that test contacts 10 are in the circuit and switch 14 is open, the power source is set to give 20 mV by controller 25. This is checked by the meter 20, the result fed to the system at 26. If the voltage is less than 20 mV, then an indication can be provided to check the system. If the voltage is 20 mV, then the current loop is closed by device 27, which closes switch 14, as by a solenoid. At this time the contacts 10 will be closed.

The meter 12 measures the loop current, the value fed to the device 28. The system then makes two decisions, depending upon the current value. If less than a preset low value, e.g. 0.5 mA, it is assumed that the contacts are bad and a signal is sent from the meter 29 via connections 31, to print out "bad contact". If the current is over the preset low value, e.g. 0.5 mA, then the system determines at 30, if the current is equal to 100 mA. If the answer is yes, then the voltage drop is measured, by meter 20, the output fed to device 32.

The system then calculates the contact resistance, at 33, decreases the open-circuit voltage of the constant current source to 20 mV, and finally causes the switch 14 to open by instructions from device 34.

The system includes a device 35 which decides whether the contacts should be tested in both directions of current. If this is required, a signal is sent to device 36 which changes the current direction as by a changeover switch indicated at 40 in FIG. 1. The process is then repeated from the controllers 24 to the device 35. The device 35 then instructs the calculator 37 to calculate the average contact resistance and feed the result to a printer. Changeover switch 14 can be operated, for example, by a solenoid.

If the loop current is determined to be over the preset low value, e.g. 0.5 mA, but less than 10 mA, at 30, then a signal is fed to a control member 38 to increase the open circuit voltage of the constant current source (11 in FIG. 1) such that the current at 30 is increased to 100 mA.

The system is one which can be adapted to test a plurality of contact pairs. Thus, for example, in a multiple pin and socket connection, appropriate connections are made to the pins and to the sockets and then related pairs of pin and socket switched into the test sequence.

Describing the system generally, it provides a 20 mV supply to a test circuit, measures the open circuit voltage to check it is 20 mV, then closes the circuit to bring in the test contacts. The loop current, i.e. the short-circuit current, is measured and if less than the preset low value, e.g. 0.5 mA, rejects the contacts. If the loop current is 100 mA, then the voltage drop across the contacts is measured and contact resistance calculated, followed by opening of the circuit. If contact resistance is to be measured in both directions, the current direction is reversed and the voltage checking, open circuit voltage measurement, loop current measurement, voltage drop measurement and contact resistance calculation repeated. The final test result is the average contact resistance for both directions, if that is carried out, or the original contact resistance if current flow in one direction only is acceptable. The system includes a feedback control which adjusts the constant current source to produce a loop current of 100 mA if the loop current is below 100 mA, but above the preset low value, e.g. 0.5 mA. This latter feature provides automatic adjustment to the constant current source, to counterbalance changes in lead length and other variables in the test circuit.

It will be seen that the open circuit voltage is never more than 20 mV prior to test. This meets one of the parameters laid down by the test standard. It will also be seen that once the circuit is closed, the loop current is either at 100 mA, or adjusted up to this value. Again this meets another of the parameters laid down by the test standard. In the course of the test, the constant current source voltage is so adjusted as to maintain the 100 mA loop circuit, in the short circuit current, without exceeding the 20 mV drop over the test contacts. Obviously, this is possible only when the test contact is 200 mA maximum. When this condition is not satisfied, the 20 mV circuit will be maintained while the loop current is decreased proportionally. Therefore, all requirements of the test standard are met.

The test system has been described for the testing of dry circuit contacts in accordance with ASTM B539 test procedure. The system can readily be applied, using other voltage and current parameters, if desired.

The various measuring devices, calculators and the other devices, can be individual electronic circuits interconnected. However, a more convenient way is to program a micro-computer which then makes the various comparisons and calculations, issuing signals to the various items such as the loop closing switch, current source adjustment, and printer.

What is claimed is:

1. A method of testing dry circuit contacts, comprising:
   connecting a constant current source to a set of contacts;
   setting said current source to a predetermined open circuit voltage;
   measuring the short circuit current supplied to said contacts;
   increasing the voltage of the constant current source to produce a short circuit current sufficient to produce a potential difference on a measurable voltage scale at said contacts;
   measuring said potential difference across said contacts;
   calculating the contact resistance from said potential difference and said short circuit current at said contacts; and
   reducing the voltage of said constant current source to at least said predetermined open circuit voltage.

2. A method as claimed in claim 1, including maintaining an open circuit between one side of said set of contacts and one side of said constant current source, closing said circuit after setting said constant current source to said predetermined open circuit voltage; and increasing the voltage of the constant current source to produce said short circuit current.

3. A method as claimed in claim 1, including reversing the current direction to said contacts after reducing the voltage of said constant current source at least to said predetermined open circuit voltage;
   resetting said constant current source to said predetermined open circuit voltage;
   measuring the short circuit current supplied to said contacts;
   increasing the voltage of the constant current source to produce a second short circuit current sufficient to produce a second potential difference on a measurable voltage scale at said contacts;
   remeasuring said second potential difference across said contacts;
   recalculating the contact resistance from said second potential difference and said second short circuit current at said contacts; and
   reducing the voltage of said constant current source to at least said predetermined open circuit voltage.

4. A method as claimed in claim 3, including maintaining an open circuit between one side of said contacts and one side of said contact current source after reversing said current direction;
   closing the circuit after resetting said constant current source to said predetermined open circuit voltage.

5. A method as claimed in claim 4, including calculating the average contact resistance for the two current directions.

6. A method of testing contact resistance of dry circuit contacts, comprising:
   (I) connecting a constant current source to a set of contacts, the test circuit being open;
   (II) setting said constant current source to a predetermined open circuit voltage;
   (III) measuring the open circuit voltage;
   (IV) checking the test circuit if the voltage is less than said set predetermined voltage;
   (V) closing the test circuit if the open circuit voltage is at said predetermined value;
   (VI) measuring the short circuit current supplied to said contacts;
   (VII) increasing the voltage of the constant current source to produce a short circuit current sufficient to produce a potential difference on a measurable voltage scale at said contacts;
   (VIII) measuring said potential difference across said contacts;
   (IX) calculating the contact resistance from said potential difference and said short circuit current at said contacts; and
   (X) reducing the voltage of said constant current source to at least said predetermined open circuit voltage; and
   (XI) opening the test circuit.

7. A method as claimed in claim 6, further comprising:
   (XII) reversing the current direction in the test circuit;
   (XIII) repeating steps (II) to (XI);
   (XIV) calculating the average contact resistance.

8. A method as claimed in claim 6 or 7, including feeding the resistance values to a printing apparatus and printing out said values.

9. A method as claimed in claim 6, including after measuring the short circuit current supplied to said contacts, indicating a bad contact condition if the short circuit current is below a predetermined value.

10. A method of testing contact resistance of dry circuit contacts, comprising:
(I) providing a 20 mV constant current source to a test circuit including a set of contacts, the circuit open;
(II) measuring the open circuit voltage to check the voltage is 20 mV;
(III) closing the test circuit to bring in said contacts;
(IV) measuring the short circuit current in the test circuit;
(V) increasing the voltage of the constant current source to bring the short circuit current to 100 mA;
(VI) measuring the potential difference across the contacts;
(VII) calculating the contact resistance from said potential difference and said short circuit current of 100 mA;
(VIII) reducing the voltage of said constant current source to 20 mV; and
(IX) opening the test circuit.

11. A method as claimed in claim 10, including the further steps of:
(X) reversing the direction of the current in the test circuit;
(XI) repeating steps (II) to (IX);
(XII) calculating the average contact resistance.

12. A system for testing the contact resistance of dry current contacts, comprising:
a test circuit including means for inserting a set of contacts to be tested;
a constant current source connected to said test circuit;
voltage setting means for setting the voltage of said constance current source to a predetermined open circuit voltage;
measuring means for measuring the closed circuit current in the test circuit;
means for increasing the voltage of said constant current source to produce a short circuit current sufficient to produce a potential difference on a measurable voltage scale at said contacts;
means for measuring said potential difference across the set of contacts;
means for calculating the contact resistance of the set of contacts.

13. A system as claimed in claim 12, including means for reversing the direction of the current in the test circuit.

* * * * *